(12) United States Patent
Norman

(10) Patent No.: US 8,000,122 B2
(45) Date of Patent: Aug. 16, 2011

(54) MEDIA PLAYER WITH NON-VOLATILE MEMORY

(75) Inventor: Robert Norman, Pendleton, OR (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 12/803,809

(22) Filed: Jul. 6, 2010

(65) Prior Publication Data

US 2010/0277962 A1    Nov. 4, 2010

Related U.S. Application Data

(63) Continuation of application No. 12/004,737, filed on Dec. 21, 2007, now Pat. No. 7,751,221.

(51) Int. Cl.
*G11C 5/02* (2006.01)
(52) U.S. Cl. .................. 365/51; 365/63; 365/189.08
(58) Field of Classification Search .............. 365/51, 365/63, 189.08
See application file for complete search history.

(56) References Cited

U.S. PATENT DOCUMENTS

| | | | |
|---|---|---|---|
| 7,519,754 B2 * | 4/2009 | Wang et al. | 710/110 |
| 7,751,221 B2 * | 7/2010 | Norman | 365/51 |
| 2003/0050087 A1 * | 3/2003 | Kwon | 455/550 |
| 2003/0206442 A1 * | 11/2003 | Tang et al. | 365/185.17 |
| 2006/0041711 A1 * | 2/2006 | Miura et al. | 711/103 |
| 2009/0164204 A1 * | 6/2009 | Norman | 703/24 |

* cited by examiner

*Primary Examiner* — Pho M Luu

(57) ABSTRACT

A media player is provided that includes a processor configured to execute a media player program, a non-volatile memory electrically coupled with the processor, the non-volatile memory being vertically configured, an input/output module electrically coupled with the processor and the non-volatile memory and configured to communicate with an input/output device, and an analog/digital module electrically coupled with the processor and the non-volatile memory, the analog/digital module configured to output a media signal. The input/output module may be in electrical communication with the input/output device and/or signal communication with the input/output device.

22 Claims, 4 Drawing Sheets

200

| Memory Layer 3 | NAND Flash Emulation | 204 |
|---|---|---|
| Memory Layer 2 | SDRAM Emulation | 203 |
| Memory Layer 1 | ROM or NOR Flash Emulation | 202 |
| | ASIC Logic   201 | |

MEDIA PLAYER WITH NON-VOLATILE MEMORY

CROSS-REFERENCES TO RELATED APPLICATIONS

This application is related to U.S. patent application Ser. No. 11/095,026, filed on Mar. 30, 2005, U.S. Published Application No. 2006/0171200, entitled "Memory using Mixed Valence Conductive Oxides" and to U.S. patent application Ser. No. 11/897,909, filed on Aug. 30, 2007, U.S. Published Application No. 2009/0063757, entitled "Memory Emulation in an Electronic Organizer."

FIELD OF THE INVENTION

The present invention relates to media players and specifically to memory.

BACKGROUND

Media player is an electronic device capable of storing and playing media files (i.e., files that include data that may be rendered, presented, viewed, propagated, or otherwise used to present content in various types of media formats) in one or more formats. Media formats include audio, video, haptic, digital, graphic, or other types of media files ("files"). Audio media formats can include MP3, Windows Media Audio (WMA), Advanced Audio Codec (AAC), Waveform (WAV), Free Lossless Audio Codec (FLAC), Ogg Vorbis, or Speex. Video media formats can include MPEG, AVI, DivX, or XviD. Likewise, digital image media formats can include BMP, JPEG, or GIF. In some conventional media players, storage capacity may be extended by using memory cards, such as a Smart Flash, Compact flash, or a memory stick, such as those developed by Sony Corporation®, SanDisk®, and others. In other conventional solutions, a hard disk-based digital audio player may be used, which stores media files in an internal hard disk drive, such as the iPod® Shuffle developed by Apple Computer of Cupertino, Calif.

Some conventional media players use read only memory (ROM), programmable read only memory (PROM), flash memory, and random access memory (RAM). ROM, PROM, or flash memory may be used to store a portion of firmware, including instructions for booting the media player. RAM may be used by a processor or other components of a media player to store program instructions or transient data during operation. However, conventional media players require a long boot process to load an operating system (OS) and to initialize various system devices. Further, if the media player unexpectedly loses power, any unsaved information will be lost. Dynamic random access memory (DRAM) is the most commonly used memory technology in media players due to its density and speed. However, DRAM requires frequent refresh cycles that may reduce performance. Flash memories are much slower than RAMs, and may be used for storing media file data to be loaded into system memory implemented by RAM. Flash memories require a flash file system for read/write capabilities. The flash file system may be included in the OS, which may lengthen the boot process even further. Each of the above-described memories has different capabilities and requirements. However, conventional memories also have unique architectural schemas and require a unique semiconductor fabrication process. Subsequently, each type of the above-described memories is usually enclosed in an individual package. Having several different memories therefore requires additional size and power consumption and results in different types of media players. Continuing efforts are being made to improve memory interfaces.

BRIEF DESCRIPTION OF THE DRAWINGS

The present invention will be readily understood by the following detailed description in conjunction with the accompanying drawings, and like reference numerals designate like structural elements. Although the Drawings depict various examples of the invention, the invention is not limited by the depicted examples. Furthermore, the depictions are not necessarily to scale.

DETAILED DESCRIPTION

Embodiments of the invention may be implemented in numerous ways, including as a system, a process, an apparatus, or as computer program instructions included on a computer readable medium such as a computer readable storage medium or a computer network wherein program instructions are sent over optical or electronic communication links.

A detailed description of one or more examples is provided below along with accompanying figures. The detailed description is provided in connection with such examples, but is not limited to any particular embodiment. The scope is limited only by the claims and numerous alternatives, modifications, and equivalents are encompassed. Numerous specific details are set forth in the following description in order to provide a thorough understanding. These details are provided for the purpose of example and the described embodiments may be implemented according to the claims without some or all of these specific details. For the purpose of clarity, technical material that is known in the technical fields related to the embodiments has not been described in detail to avoid unnecessarily obscuring the description.

Media players may be used with non-volatile memory technologies such as those disclosed in U.S. patent application Ser. No. 11/095,026, filed Mar. 30, 2005, U.S. Published Application No. 2006/0171200, and titled "Memory Using Mixed Valence Conductive Oxides," hereby incorporated by reference in its entirety and for all purposes, describes two terminal memory cells that can be arranged in a cross point array and configured vertically. These memory elements are inherently non-volatile in that they retain their contents without continuous power such as a battery backup. They do not require a refresh as a DRAM requires, and do not require an erase or an operating system (OS) like flash memory. They are therefore suitable for several different uses: they have sufficient performance to replace DRAM, while being non-volatile, allowing them to replace flash memory and ROM. In some examples, the above-described memory implementation may be used to replace or emulate other memory or storage technologies. Memory emulation techniques may be used, such as those described in U.S. patent application Ser. No. 11/897,909, filed on Aug. 30, 2007, U.S. Published Application No. 2009/0063757, entitled "Memory Emulation in an Electronic Organizer", which is incorporated by reference herein for all purposes. A unified non-volatile memory array (i.e., "memory" or "memory array") using the above-described memory techniques may be used in a media player design.

Figure 1:
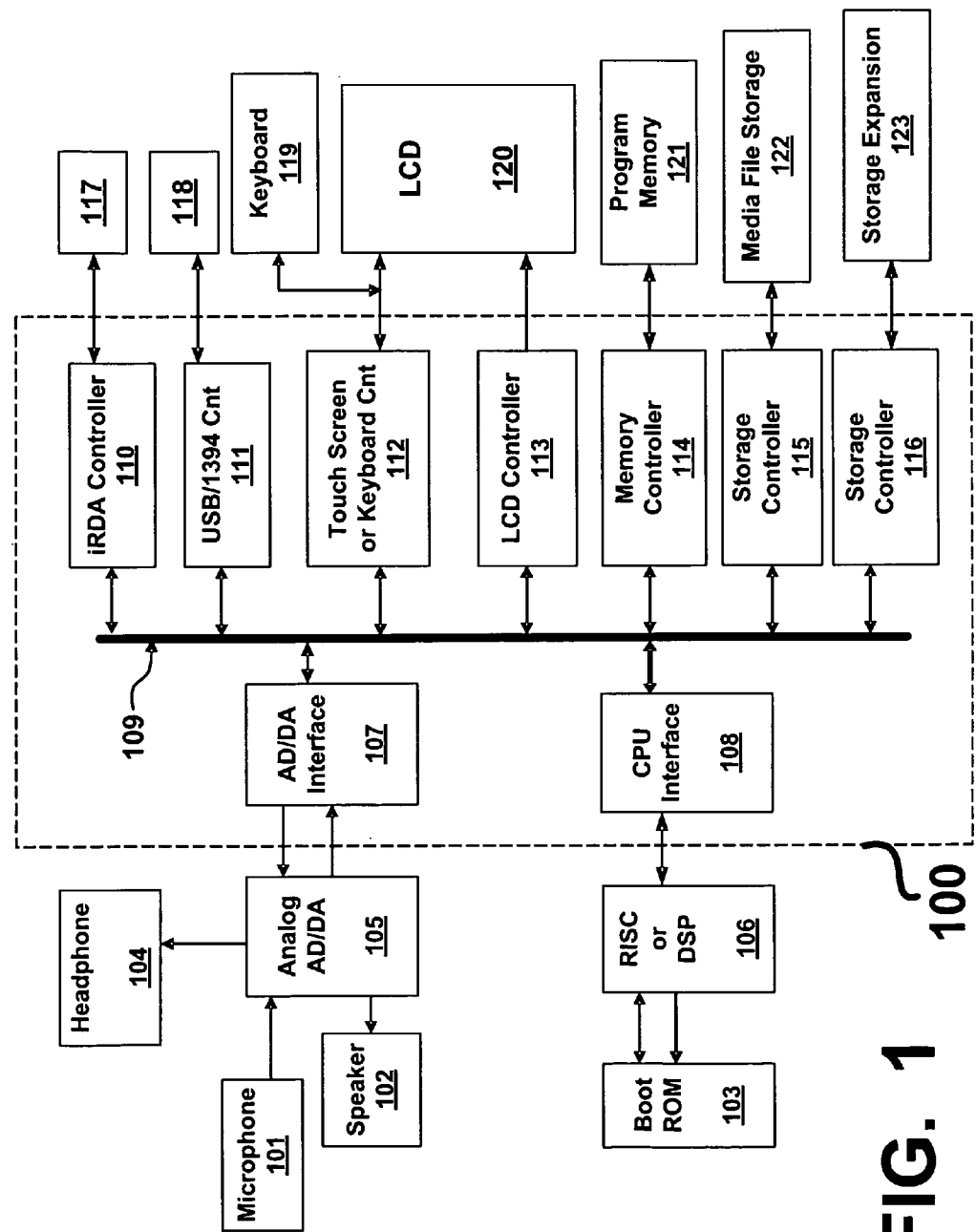
FIG. 1 illustrates an exemplary media player system.

FIG. 1 illustrates an exemplary media player system. In some examples, an exemplary media player includes logic circuit component 100, microphone 101, speaker 102, boot ROM 103, headphone 104, analog/digital (AD/DA) converter 105, processor 106, server connections 117 and 118, keyboard 119, display 120, memory device 121, and storage devices 122-123. Here, logic circuit component 100 further includes analog/digital (AD/DA) interface 107, processor interface 108, control bus 109, infrared (iRDA) controller 110, USB/1394 controller 111, touch screen or keyboard controller 112, LCD controller 113, and controllers 114-116 (e.g., memory controller 114, storage controller 115, and storage controller 116). Within logic circuit component 100, AD/DA interface 107 connects to AD/DA converter 105, which may be coupled to a media device (e.g., media player, MP3 player, iPod®, and others). In some examples, input/output modules 110-113 may include infrared controller 110 and USB/1394 controller 111 for downloading media files using external server connections 117 and 118. Touch screen or keyboard controller 112 may be used to control (e.g., receive, send, route, manage, or otherwise handle) signals from keyboard 119 and LCD 120. LCD controller 113 may also be configured to control LCD 120. In some examples, LCD 120 may display a media play list (not shown) and other user interface information or actions, such as play, stop, forward, rewind, shuffle, and the like.

In some examples, controllers 114-116 may include memory controller 114, which may be configured to control program memory 121. Likewise, control program memory 121 may be configured to store a media player program. When executed, the media player program may play a song, show a video, display an image, and the like. Controllers 114-116 may also include storage controller 115 for controlling media file storage device 122. Here, media file storage device 122 may store one or more media files (e.g., songs, videos, images, and the like). Controllers 114-116 may also include storage controller 116, which may be configured to control storage expansion device 123. As an example, media file storage capacity may be increased by using the storage expansion device 123. The storage expansion device 123 may also be used to provide different folders (e.g., containers or objects used to organize or store media files) of media files (e.g. music files, video files, haptic files, or other types of media files). In other examples, storage expansion device may be used to differently and is not limited to the description provided above.

In some examples, the types, number, and configuration of components may be varied. For example, AD/DA converter 105 may be part of an external media device (not shown) that also includes microphone 101, speaker 102, and headphone 104. In other examples, more, fewer, or different elements may be included as part of an external media device. Here, processor 106 may be a RISC, DSP, or other types of computer, micro controller, or processor architecture. Storage expansion device 123 may be implemented using a flash memory plug-in card (e.g., Compact Flash®, Smart Flash, Memory Stick®, SD®, or others), external hard disk plug-in module, or the like. In other examples, components may be varied, supplemented, or replaced. For example, infrared controller 110 may be replaced by a wireless controller for receiving a media file downloaded using wireless data communication (e.g. WI-FI, or the like) through the external server connection 117.

Here, boot ROM 103, program memory 121 or media file storage device 122 may be implemented using a memory or memory array such as the above-described non-volatile memory. While boot ROM 103 may be implemented using flash memory, ROM, PROM, or other types of ROM and program memory 121 may be implemented using DRAM, synchronous DRAM (SDRAM), static RAM (SRAM), or the like, a two-terminal, vertically-configured memory array may be implemented to emulate one or both of boot ROM 103 and program memory 121 to reduce volatility (i.e., power) and size requirements, thus enabling smaller media players with larger media file storage capacity that are configured to render, display, play, or otherwise present media files without the delays of conventional techniques. Media file storage device 122 may also be implemented using flash memory, hard disk drives, or other types of memory or storage devices, but may also be emulated using a memory or memory such as the above-referenced implementations from Unity Semiconductor of Sunnyvale, Calif. In other examples, media file storage device 122 may be implemented using flash memory, supplemented by one or more additional hard disk storage devices (i.e., drives) in order to expand storage capacity. In some examples, boot ROM 103 may include a NOR-type flash memory and media file storage device 122 or storage expansion device 123 may include a NAND-type flash memory. In other examples, boot ROM 103, media file storage device 122, and storage expansion device 123 may be implemented differently and is not limited to the above-described embodiments.

In some examples, processor 106 may be used to manage media file data structures, interface handshakes and controller setups and execute encoding and decoding algorithms. For example, processor 106 may load operating code from boot ROM 103 during an initial boot sequence after power has been applied. Operating code may be loaded into program memory 121. Processor 106 may execute a media player program from program memory 121 using a memory controller, which may be implemented using one or more of controllers 114-116. Likewise, one or more of controllers 114-116 may be used to implement LCD controller 113. As another example, controller 114 may be implemented as a two-port memory controller and used to interface with processor 106 and LCD controller 113. In some examples, LCD controller 113 may be implemented as a master and used to refresh an image on LCD 120 by pulling image data stored in program memory 121 over control bus 109 by using a direct memory access (DMA) operation.

In yet other examples, memory controller 114 may be implemented as a two-port controller and may be used to interface to processor 106 and to AD/DA interface 107. AD/DA interface 107 may act as a master to send a media data stream to AD/DA converter 105 from a data buffer configured in program memory 121 over control bus 109 by using a DMA operation. The data buffer configured in program memory 121 may be used to ensure an uninterrupted media data stream originating from a media file stored in media file storage device 122. In other examples, the controller 114 may be multi-ported to allow simultaneous control of an LCD port, an AD/DA, and a processor.

Components within logic circuit component 100 (e.g., AD/DA interface 107, processor interface 108, and others) may be implemented as a field programmable gate array (FPGA) or application specific integrated circuit (ASIC) with memory and analog devices added as attachments. For example, some, part, or all of logic circuit component 100 may be implemented in an FPGA. In other examples, an ASIC or other custom integrated circuit may be used to implement logic circuit component 100. In some examples, boot ROM 103, program memory 121 or media file storage device 122 may be implemented using the above-described non-volatile memory for inclusion in an ASIC or other custom designed and/or integrated circuit. Controllers 114-116 and other related circuitries may also be adapted accordingly for controlling the above-described non-volatile memory. In other examples, the above-described system may be implemented using more, fewer, or different elements, in addition to using a two-terminal, vertically configured memory array or memory to replace conventional memories, as discussed above.

Figure 2:
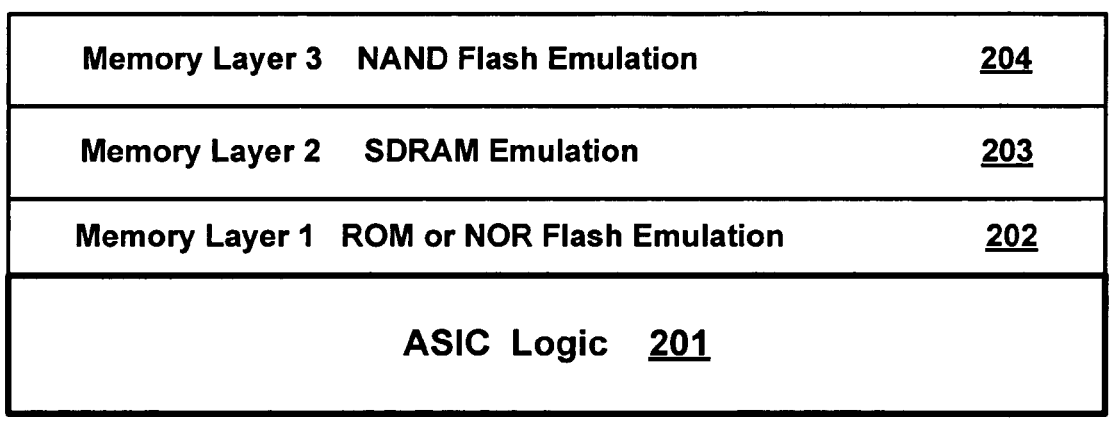
FIG. 2 illustrates an exemplary vertical plane configuration for use with a media player integrated circuit.

FIG. 2 illustrates an exemplary memory array for use with a media player integrated circuit. Here, integrated circuit 200 includes semiconductor circuit 201, memory layers 202-204. In some examples, more or fewer layers may be implemented and integrated circuit is not limited to the number or types of layers shown. For example, semiconductor circuit 201 may be a custom integrated circuit, ASIC, FPGA, or other type of integrated circuit and may be implemented using a silicon substrate or other types of semiconductor substrate materials. In some examples, semiconductor circuit 201 may include some, part, or all of logic circuit component 100 (FIG. 1). In some examples, integrated circuit 200 may be implemented using a two-terminal, vertically-configured, non-volatile memory array that uses memory layers 202-204 to implement various types of memory or storage components. Memory layer 202 may be used to emulate a ROM or a NOR-type flash memory, which may be used for boot ROM 103 (FIG. 1). Memory layer 203 may be used to emulate SDRAM and to implement program memory 121 (FIG. 1). Memory layer 204 may be used to emulate a NAND-type flash memory, which may also be used to implement media file storage device 122 (FIG. 1). Although three memory layers (i.e., memory layers 202-204) are shown and described, the quantity, order, design, and function of memory layers 202-204 may be varied and are not limited to the embodiments shown. For example, implementation of additional memory layers may be used to implement higher storage capacity to enable greater amounts of media data (e.g., files) to be stored. In other examples, there may be fewer memory layers. For example, portions of boot ROM 103 (FIG. 1), program memory 121 (FIG. 1), or media file storage device 122 (FIG. 1) may be implemented using memory techniques, such as the two-terminal, vertically-configured, non-volatile memory and memory arrays described above. In other examples, semiconductor circuit 201 may be implemented differently using more, fewer, or different elements than those shown and described. As another example, the one or more of the memory layers 202-204 depicted in FIG. 2 can be portioned into one or more sub-planes such that memory types that serve different functions can be emulated in the same memory layer. As a further example, memory layer 204 can be portioned so that a first portion of memory layer 204 emulates boot ROM and a second portion emulates program memory. The logic circuit component 100 can be fabricated in the semiconductor circuit 201 layer (e.g., in a silicon Si wafer) and the memory layers 202-204 can be fabricated on top of the semiconductor circuit 201 layer. Interlayer connection structures that are well understood in the microelectronics art (e.g., vias, damascene structures, contacts, plugs, etc.) can be used to electrically couple the memory layers 202-204 with circuitry in the semiconductor circuit 201 layer.

Figure 3:
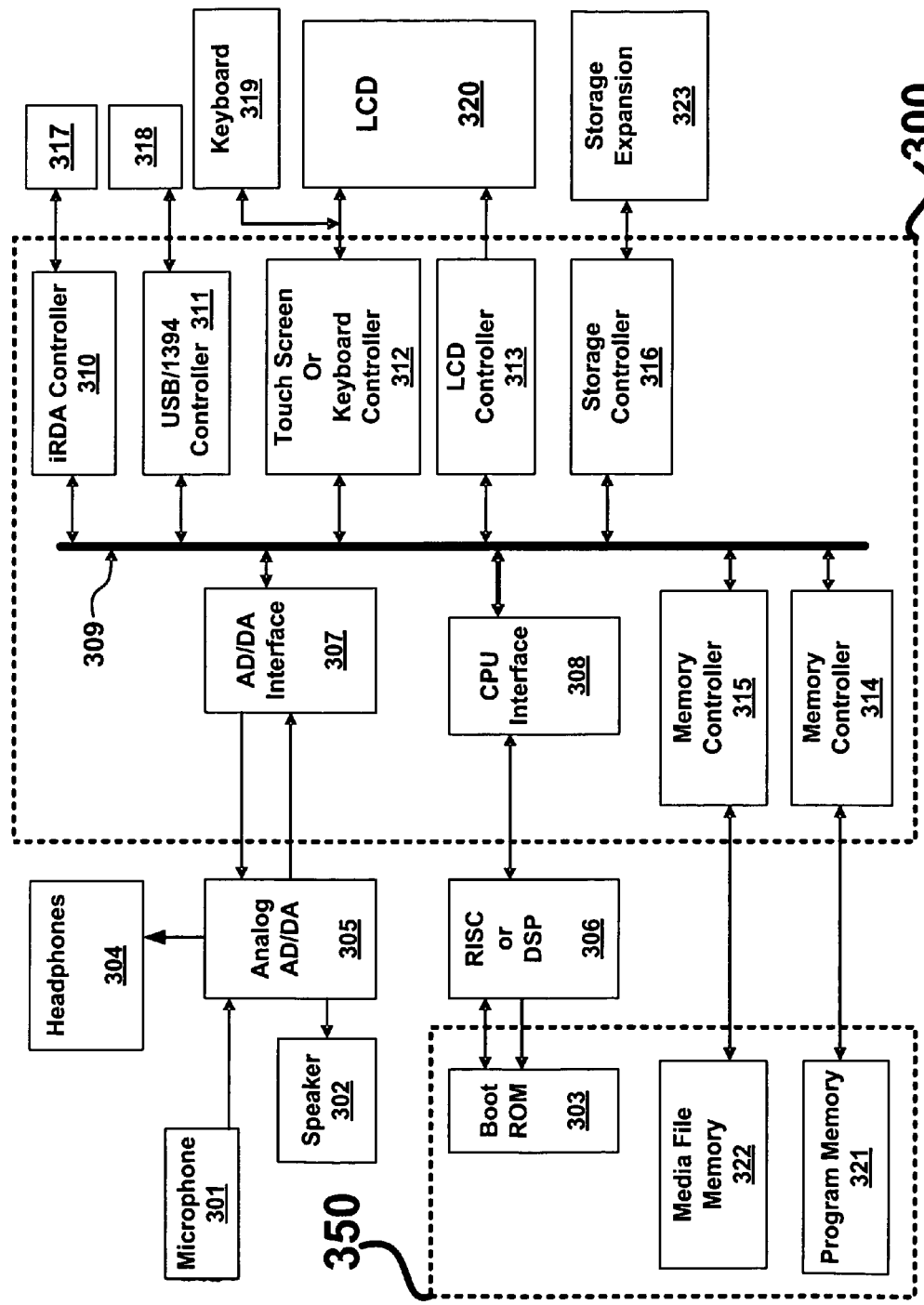
FIG. 3 illustrates an alternative exemplary media player system.

FIG. 3 illustrates an alternative exemplary media player system. Here, logic circuit component 300, microphone 301, speaker 302, headphone 304, analog/digital (AD/DA) converter 305, processor 306, server connections 317 and 318, keyboard 319, display 320, and memory array 350 are shown. Logic circuit component 300 further includes analog/digital (AD/DA) interface 307, processor interface 308, control bus 309, infrared (iRDA) controller 310, USB/1394 controller 311, touch screen and keyboard controller 312, LCD controller 313, and controllers 314-316. Within logic circuit component 300, AD/DA interface 307 connects to AD/DA converter 305 of a media device (not shown). Infrared controller 310 and USB/1394 controller 311 may be used to retrieve (i.e., download) media files using external server connections 317 and 318. Touch screen and keyboard controller 312 may be used to control keyboard 319 and LCD 320. LCD controller 313 may be used to control LCD 320. LCD 320 may be configured to display a media play list and other user interface information and actions, such as play, stop, forward, rewind, shuffle, and the like. Controllers 314-316 may include storage controller 316 for controlling storage expansion device 323. In some examples, storage expansion device 323 may be implemented using a two-terminal, non-volatile, vertically-configured memory array, such as those described above. The storage capacity of media files may be increased by using storage expansion device 323. Storage expansion device 323 may also be used to change or switch between different folders of media files (e.g., music files, video files, haptic files, or other types of media files). Controllers 314-316 may also implemented as memory controllers configured to control memory array 350.

In some examples, memory array 350 may be used to emulate various different memory or storage functionalities required in the media player. Here, "emulation" refers to using a portion of memory array 350 to perform functions assigned to memory or storage devices. For example, memory array 350 may be implemented to provide program memory 321 (i.e., emulating RAM), media file memory 322 (i.e., emulating flash memory), and boot ROM 303 (i.e., emulating ROM). Here, memory array 350 may be used to emulate one, some, or all (as shown and described here) of these memory functions. By implementing memory array 350 by using the above-described two-terminal, vertically-configured, non-volatile memory techniques, power and size requirements may be reduced. Further, by using a two-terminal, vertically-configured memory array that is configured to perform write operations without intervening erase operations, media player performance (e.g., retrieval, playing, download, and storage of media files) may be enhanced.

In other examples, media file memory 322 may be used to emulating a hard disk drive to achieve high storage capacity for media files. Program memory 321, media file memory 322, and boot ROM 303 may be assigned a physical portion of memory array 350. For example, if memory array 350 has 128 megabytes (MB) of data storage capacity, then 96 MB may be allocated to RAM emulation, 30 MB may be allocated to flash memory emulation, and 2 MB may be allocated to ROM emulation. In other examples, if memory array 350 totals 30 gigabytes (GB), 15 GB may be allocated to RAM emulation and 15 GB may be allocated to hard disk drive emulation. Alternatively, some, all, or none of program memory 321, media file memory 322, and boot ROM 303 may be dynamically allocated within memory array 350. Allocation of program memory 321, media file memory 322, and boot ROM 303 may be determined by a program being run or by a media player based on the needs of a program being run. Programs that may be run on processor 306 may include decoding and encoding applications for audio files (e.g., mp3, .wav, .wmv, and others). Processor 306 may also be configured to execute code for managing DMA portions of memory controllers (i.e., controllers 314-316) and setting address pointers and transfer counts. In some examples, programs run on processor 306 may be used to manage IO capabilities of various ports. For example, a program may be used to managing a file system for a non-volatile memory (e.g., flash file system, and others). Using two-terminal, non-volatile, vertically configured memory or memory array such as those referenced above, may be used to perform write operations without erase operations performed between each write operation. Thus, complexity of applications may be reduced by eliminating the need to perform erase operations and erase management when managing a non-volatile memory array such as those referenced above.

In some examples, memory array 350 may be used to replace several memories. By using a single memory or memory array rather than several different types of memories, less space is required on a media player motherboard (i.e., the size requirement may be reduced). Further, by having fewer leads to various integrated circuits (ICs) on a media player motherboard, less power is lost during signal transmission. Additionally, memory array 350 requires less power and board space than other memory technologies (e.g., Flash, ROM, RAM, SDRAM, and others).

For example, program memory 321 may be used for RAM emulation. As a portion of memory array 350, when used to emulate RAM, program memory 321 retains the current state of a program if a power loss occurs. Therefore, a user can turn a media player off (i.e., secure or remove power) while a media file is playing. When the user turns the media player on (i.e., restores power), program memory 321 emulating RAM has retained its previous state and a media file being played may resume playing from the point at which the user turned the system off.

In other examples, media file memory 322 may be used for flash memory emulation to store media files. Memory array 350 does not require a flash file system and no erase operation needs to be performed between write operations, which increases the speed of write operations and the performance and convenience of playing and downloading media files. Media file memory 322 may be used for hard disk drive emulation given a high density of memory array 350. In yet other examples, media files may be stored in a portion of program memory 321 (i.e., a portion of memory array 350 that is configured to provide program memory such as program memory 321) used to emulate RAM. Storage may be performed without allocating memory for flash or hard disk emulation.

Here, the boot ROM 303 may be used for ROM emulation. The boot ROM may be used to store program instructions to boot up an operating system and initialize other system configurations and parameters. For example, the operating system and a media player program may be stored in memory array 350 and processor 306 may load operating system into program memory 321 to emulate RAM during an initial boot sequence after power has been applied. An operating system subsequently loads a media player program into program memory 321, thus emulating RAM. In still other examples, an operating system or a media player program may be stored in program memory 321, also emulating RAM until a change occurs. Thus, a lengthy boot process may be eliminated by avoiding the loading of an operating system and a media player program when the media player is turned on. By eliminating lengthy boot processes, overall memory capacity requirements may also be eliminated. Subsequently, program (i.e., application) memory requirements stored in ROM or Flash memory arrays are also reduced or eliminated. In other words, use of a two-terminal, non-volatile, vertically-configured memory or memory array eliminates the need to copy a file to SRAM or DRAM, thus improving file access speeds and play.

Figure 4:
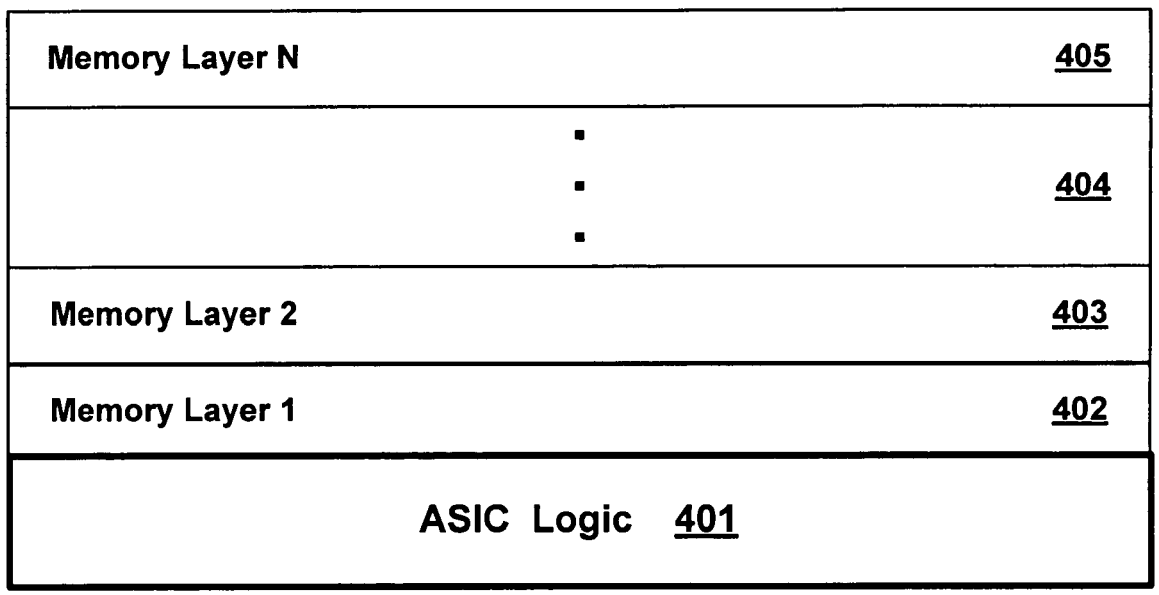
FIG. 4 illustrates a vertical plane configuration of an alternative exemplary media player integrated circuit.

FIG. 4 illustrates a vertical plane configuration of an alternative exemplary media player integrated circuit. Here, an integrated circuit 400 includes semiconductor circuit 401, memory layers 402-404, and an Nth memory layer 405. In some examples, semiconductor circuit 401 may be a custom integrated circuit, ASIC, FPGA, or other type of integrated circuit and may be implemented using a silicon substrate or other types of semiconductor substrate materials. Here, semiconductor circuit 401 may include some, none, or all of logic circuit component 300 (FIG. 3). In other examples, semiconductor circuit 401 may include AD/DA converter 305 or processor 306 in addition to some, none, or all of logic circuit component 300 (FIG. 3). In some examples, memory layers 402-405 may be implemented using one or more memory arrays or one or more portions of memory array 350 (FIG. 3), each of which may be configured to emulate ROM, RAM, flash memory, hard disk drive, or other memory or storage devices. One or more of these several memory arrays may be a two-terminal, vertically configured, non-volatile memory array, such as those described above. Likewise, memory layers 402-405 may be implemented using a two-terminal, vertically-configured, non-volatile memory array, such as those described above. For example, one or more physical portions of a memory may be assigned to perform various memory or storage functions required by a media player. In still other examples, one or more portions of a memory may be dynamically allocated to perform various memory or storage functions of a media player. Allocation of memory may be determined by a program being run or by a media player based on the current needs of a program. In yet other examples, an operating system, other system configurations, media player program, media files, and other information or program instructions may be stored in a memory (e.g., memory array 350 (FIG. 3)) until changed, thus eliminating the need for a boot program, boot sequence, media file data buffer, and other data buffering/caching/transferring requirements. Although FIG. 4 includes a plurality of memory layers, in some examples, one memory layer of a memory or memory array may be used. In other examples, the various memory layers shown in integrated circuit 400 may be varied in design, operation, and implementation and are not limited to the examples shown and described.

Although the foregoing embodiments have been described in detail for purposes of clarity of understanding, certain changes and modifications may be practiced within the scope of the appended claims. Accordingly, the present embodiments are to be considered as illustrative and not restrictive, and not limited to the details given herein and may be modified within the scope and equivalents of the appended claims. In the claims, elements and/or steps do not imply any particular order of operation, unless explicitly stated in the claims.

What is claimed is:

1. A media player, comprising:
 a processor configured to execute program instructions including instructions for an operating system and instructions for a media player program;
 an integrated circuit including a substrate having active circuitry fabricated on the substrate and electrically coupled with the processor; and
 at least one layer of non-volatile two-terminal cross-point memory electrically coupled with the active circuitry, the at least one layer of non-volatile two-terminal cross-point memory in contact with and vertically configured above the substrate, and the at least one layer of non-volatile two-terminal cross-point memory is randomly accessible and does not require an erase operation prior to a write operation, the active circuitry including an input/output module electrically coupled with the processor and the at least one layer of non-volatile two-terminal cross-point memory, the input/output module configured to communicate with an input/output device, and an analog/digital module electrically coupled with the processor and the at least one layer of non-volatile two-terminal cross-point memory, the analog/digital module configured to output a media signal, and wherein a first portion of the at least one layer of non-volatile two-terminal cross-point memory is configured as a boot ROM to store the operating system and a second portion of the at least one layer of non-volatile two-terminal cross-point memory is configured as program memory to store the media player program.

2. The media player of claim 1, wherein the first portion emulates Flash memory.

3. The media player of claim 2, wherein the Flash memory comprises NOR-type Flash memory.

4. The media player of claim 1, wherein the second portion emulates Flash memory.

5. The media player of claim 4, wherein the Flash memory comprises NAND-type Flash memory.

6. The media player of claim 1, wherein the at least one layer of non-volatile two-terminal cross-point memory is configured as at least one two-terminal cross-point memory array.

7. The media player of claim 6, wherein the at least one two-terminal cross-point memory array includes a plurality of two-terminal non-volatile memory elements.

8. The media player of claim 1, wherein a third portion of the at least one layer of non-volatile two-terminal cross-point memory is configured as data storage to store at least one media file.

9. The media player of claim 8, wherein the third portion emulates Flash memory.

10. The media player of claim 9, wherein the Flash memory comprises NAND-type Flash memory.

11. The media player of claim 8, wherein the third portion emulates a hard disc drive.

12. The media player of claim 1, wherein the active circuitry includes the processor.

13. The media player of claim 1, wherein other portions of the at least one layer of non-volatile two-terminal cross-point memory are configured to emulate one or more memory types selected from the group consisting of SRAM, DRAM, SDRAM, Flash, and ROM.

14. The media player of claim 1, wherein data stored in one or more portions of the at least one layer of non-volatile two-terminal cross-point memory is dynamically allocated.

15. The media player of claim 1, wherein data stored in one or more portions of the at least one layer of non-volatile two-terminal cross-point memory is physically assigned.

16. A computer readable medium including executable program instructions for a media player, comprising:

a substrate including active circuitry fabricated on the substrate; and at least one layer of non-volatile two-terminal cross-point memory electrically coupled with the active circuitry, the at least one layer of non-volatile two-terminal cross-point memory in contact with and vertically configured above the substrate, and the at least one layer of non-volatile two-terminal cross-point memory is randomly accessible and does not require an erase operation prior to a write operation, and wherein a first portion of the at least one layer of non-volatile two-terminal cross-point memory is configured as a boot ROM to store executable code for an operating system and a second portion of the at least one layer of non-volatile two-terminal cross-point memory is configured as program memory to store executable code for a media player program.

17. The computer readable medium of claim 16, wherein a third portion of the at least one layer of non-volatile two-terminal cross-point memory is configured as memory to store executable code for at least one media file.

18. The computer readable medium of claim 16, wherein the active circuitry includes a processor that is electrically coupled with the active circuitry and is configure to execute the executable code for the operating system and the media player program.

19. The computer readable medium of claim 18, wherein a third portion of the at least one layer of non-volatile two-terminal cross-point memory is configured as memory to store executable code for at least one media file and the processor is configure to execute the executable code for the at least one media file.

20. The computer readable medium of claim 16, wherein the at least one layer of non-volatile two-terminal cross-point memory is configured as at least one two-terminal cross-point memory array that includes a plurality of two-terminal non-volatile memory elements.

21. The computer readable medium of claim 16 and further comprising:

an integrated circuit including the substrate and the at least one layer of non-volatile two-terminal cross-point memory.

22. The computer readable medium of claim 21, wherein the active circuitry includes a processor that is electrically coupled with the active circuitry and is configure to execute the executable code for the operating system and the media player program.

* * * * *